United States Patent
Sjoroos et al.

(10) Patent No.: US 10,495,519 B2
(45) Date of Patent: Dec. 3, 2019

(54) TEMPERATURE ESTIMATION IN POWER SEMICONDUCTOR DEVICE IN ELECTRIC DRIVE SYSTEM

(71) Applicant: ABB OY, Helsinki (FI)

(72) Inventors: Jukka-Pekka Sjoroos, Brookfield, WI (US); Kari Tikkanen, New Berlin, WI (US)

(73) Assignee: ABB Schweiz AG, Baden (CH)

( * ) Notice: Subject to any disclaimer, the term of this patent is extended or adjusted under 35 U.S.C. 154(b) by 499 days.

(21) Appl. No.: 15/189,902

(22) Filed: Jun. 22, 2016

(65) Prior Publication Data

US 2016/0377488 A1    Dec. 29, 2016

Related U.S. Application Data

(60) Provisional application No. 62/184,669, filed on Jun. 25, 2015.

(51) Int. Cl.
| | |
|---|---|
| *G01K 7/00* | (2006.01) |
| *H02P 29/02* | (2016.01) |
| *G01R 31/26* | (2014.01) |
| *H03K 17/18* | (2006.01) |
| *H03K 17/08* | (2006.01) |
| *H02M 1/32* | (2007.01) |

(52) U.S. Cl.
CPC .......... *G01K 7/00* (2013.01); *G01R 31/2642* (2013.01); *H02P 29/02* (2013.01); *H03K 17/18* (2013.01); *H02M 2001/327* (2013.01); *H03K 2017/0806* (2013.01)

(58) Field of Classification Search
CPC ...... G01K 7/00; G01R 31/44; G01R 31/2642; H03K 17/18; H03K 2017/0806; H02M 2001/327; H02P 29/02
See application file for complete search history.

(56) References Cited

U.S. PATENT DOCUMENTS

| 5,877,419 A | 3/1999 | Farokhzad |
| 6,612,738 B2 | 9/2003 | Beer et al. |

(Continued)

FOREIGN PATENT DOCUMENTS

| DE | 10351843 | 6/2005 |
| DE | 10351843 | 11/2013 |

(Continued)

OTHER PUBLICATIONS

Yali Xiong, et al., "Prognostics and Warning System for Power-Electronic Modules in Electric, Hybrid Electric and Fuel Cell Vehicles", IEEE Transactions on Industry Applications, vol. 55, No. 6, Jun. 2008, pp. 2268-2276.

(Continued)

*Primary Examiner* — Daniel S Larkin
*Assistant Examiner* — Anthony W Megna Fuentes
(74) *Attorney, Agent, or Firm* — Taft Stettinius & Hollister LLP; J. Bruce Schelkopf (57) ABSTRACT

Estimating junction temperature in a power semiconductor includes monitoring electrical current direction so as to determine which of a first and a second power semiconductor is in an on-state, and sensing a voltage drop across the one of the power semiconductors. Voltage drop may be correlated with temperature according to a gain dependent upon a level of the electrical current.

18 Claims, 6 Drawing Sheets

(56) References Cited

U.S. PATENT DOCUMENTS

| | | | |
|---|---|---|---|
| 8,600,685 | B2 | 12/2013 | Kalgren et al. |
| 2005/0073273 | A1* | 4/2005 | Maslov ............... H02P 6/12 |
| | | | 318/437 |
| 2009/0160476 | A1 | 6/2009 | Omaru |
| 2011/0015881 | A1 | 1/2011 | Chen |
| 2012/0319759 | A1* | 12/2012 | Kobayashi ....... H03K 19/00369 |
| | | | 327/512 |
| 2013/0328596 | A1 | 12/2013 | Zoels |
| 2014/0125366 | A1 | 5/2014 | Thogersen et al. |
| 2014/0212289 | A1 | 7/2014 | Thogersen et al. |
| 2014/0253170 | A1 | 9/2014 | Lipp |

FOREIGN PATENT DOCUMENTS

| | | |
|---|---|---|
| EP | 1983640 | 4/2012 |
| WO | 2007008940 | 1/2007 |

OTHER PUBLICATIONS

Martin Knecht, "Datasheet Technical Information", FF300R12KE3 Infineon Technologies, Jun. 27, 2007.

U. Scheuermann, et al., "Power Cycling Lifetime of Advanced Power Modules for Different Temperature Swings", Semikron Elektonik Nuremger Germany, Apr. 8, 2014, pp. 1-6.

Arendt Wintrich, et al., "Application Manual Power Semiconductors", Semikron International GmbH.

Allen R. Hefner, Jr. "A Dynamic Electro-Thermal Model for the IGBT", IEEE Transactions on Industry Applications, vol. 30, No. 2, Mar./Apr. 1964, pp. 398-405.

Yong-Seok Kim, et al. "On-Line Estimation of IGBT Junction Temperature Using On-State Voltage Drop", IEEE Transactions on Industry Applications, Jan. 1998, pp. 853-859.

Ghimire Pramod et al. "Improving Power Convertere Reliabiity: Online Monitoring of High-Power IGBT Modules", IEEE Industrial Electronics Magazine, vol. 8, No. 3, Sep. 1, 2014, pp. 40-50.

Allen R. Hefner, Jr., "A Dynamic Electro-Model for the IGBT", IEEE Transactions on Industry Applications. vol. 30 No. 2, Mar./Apr. 1994, pp. 394-405.

Yong-Seok Kim, et al., "On-Line Estimation of IGBT Junction Temperature Using On-Stae Voltage Drop", In IAS Conf. Rec., (St. Louis), Oct. 1998, pp. 853-859.

Bahun Ian, et al. "Real Time Measurement of IGBT's Operation Temperature", Automatika 52, 2011, pp. 295-305.

U. Scheuermann, et al., "Investigation on the Vce(T)-Method to Determine the Junctoin Temperature by Using the Chip Itself as Sensor", Abstract for PCIM Europe, 2009, pp. 1-3.

Ghimire, Pramod Et al., "Improved Power Convertere Reliability: Online Monitoring of High-Power IGBT Modules", Industrial Electronics Magazine, vol. 8, No. 3, Sep. 19, 2014, pp. 40-50.

European Examination Report; European Patent Office; European Patent Application No. 16175730.7, dated Dec. 15, 2016; 10 pages.

* cited by examiner

TEMPERATURE ESTIMATION IN POWER SEMICONDUCTOR DEVICE IN ELECTRIC DRIVE SYSTEM

TECHNICAL FIELD

The present disclosure relates generally to junction temperature estimation in a power semiconductor device, and more particularly to junction temperature estimation based upon a voltage drop across the power semiconductor device in an on-state.

BACKGROUND

A great many different types of machines are powered primarily or in part with electric drive systems. Examples include electrically propelled land and water vehicles, industrial equipment, elevators, and many others. Like all mechanical and electromechanical systems extremes of temperature during operation and/or thermal fatigue over time can occur in electric drives, leading to performance degradation or failure. Direct observation of temperature can be challenging or impossible particularly when an electric drive system is in service in the field. The industry is therefore welcoming of advances in relation to temperature measurement or estimation.

SUMMARY

Estimating junction temperature of a power semiconductor device in an electric drive system includes monitoring a direction of flow of electrical current so as to determine which of a first and a second power semiconductor in the electric drive system is in an on-state, and determining a value indicative of the junction temperature based on a voltage drop across the one of the power semiconductors in an on-state.

DETAILED DESCRIPTION OF ILLUSTRATIVE EMBODIMENTS

For purposes of promoting an understanding of the principles of the TEMPERATURE ESTIMATION IN POWER SEMICONDUCTOR DEVICE IN ELECTRIC DRIVE SYSTEM, reference will now be made to the examples illustrated in the drawings, and specific language will be used to describe the same. It will nonetheless be understood that no limitation of the scope of the invention is intended by the illustration and description of certain examples of the invention. In addition, any alterations and/or modifications of the illustrated and/or described embodiment(s) are contemplated as being within the scope of the present invention. Further, any other applications of the principles of the invention, as illustrated and/or described herein, as would normally occur to one skilled in the art to which the invention pertains, are contemplated as being within the scope of the present invention.

Figure 1:
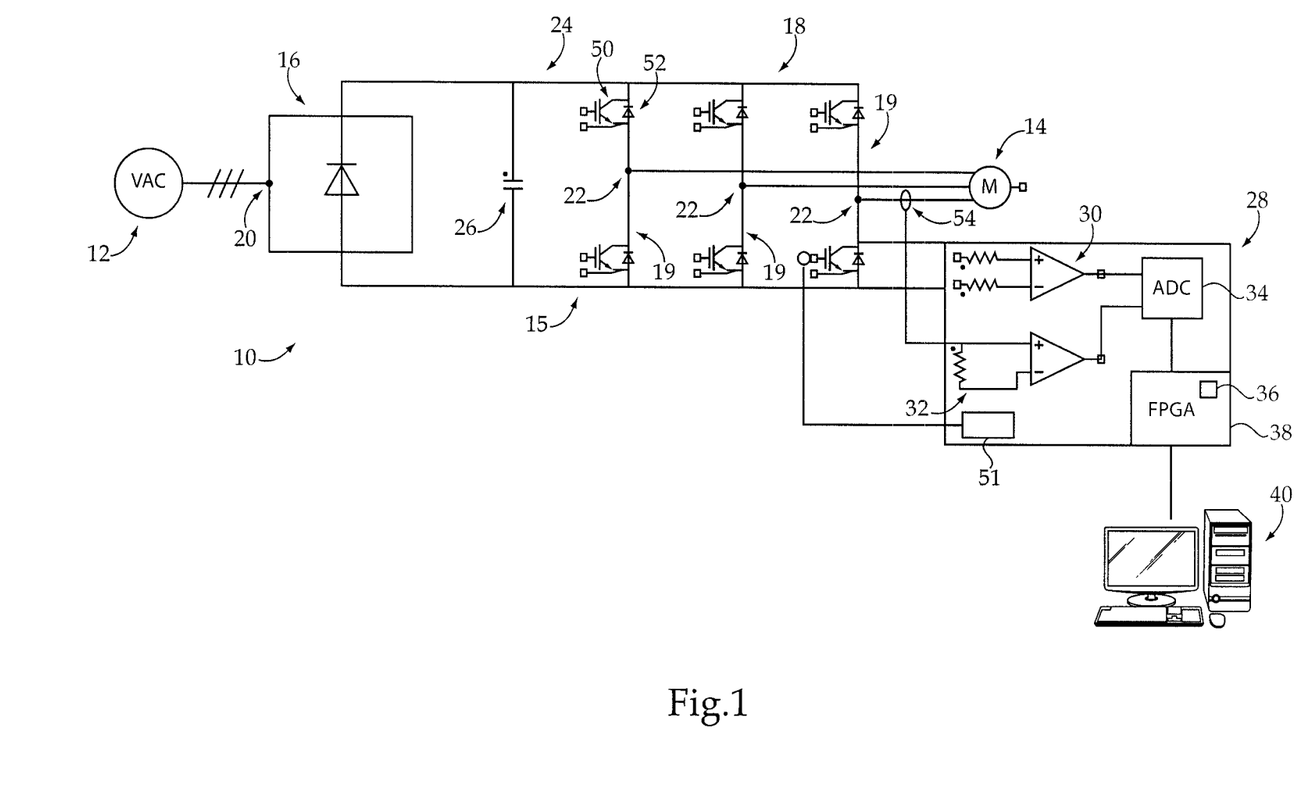
FIG. 1 is a schematic view of an electrical drive system according to one embodiment.

Referring to FIG. 1, there is shown an electric drive system 10 according to one embodiment, and structured so as to supply electrical power from a power supply 12 such as a three-phase alternating current (AC) power supply 12 to an external electrical load 14. Power supply 12 might include an AC electrical grid such as a municipal electrical grid, an industrial electrical grid, or an onsite generator such as a wind generator, a hydroelectric generator, or a combustion engine generator. External load 14 may include an electric motor such as a three-phase AC electric motor or a DC electric motor in a traction mechanism for vehicle propulsion, an electrically powered rotary or linear actuator for all manner of industrial or manufacturing processes, an electric heater, or still another application such as an electric motor for powering an elevator. For reasons that will be further apparent from the following description, system 10 is uniquely structured so as to enable estimating junction temperature in power semiconductor devices as in system 10.

In the illustrated embodiment, system 10 includes a power module 15 having a front end 16 with input nodes 20 coupled with power supply 12. Front end 16 may include a rectifier such as an actively controlled or a passive rectifier where input nodes 20 are AC input nodes, although the present disclosure is not thereby limited. Power module 15 may further include an electrical link such as a DC link 24, having a DC link capacitor 26 that couples front end 16 with a back end 18. Back end 18, discussed in more detail below, may include output nodes 22 such as AC output nodes that connect power module 15 with external load 14. In the illustrated embodiment, back end 18 is structured as an inverter and includes three phase legs 19 that can be coupled with three or any multiple of three motor windings in motor 14, for instance. In other embodiments, a different number of legs and/or motor windings might be used. Embodiments are contemplated where only a single leg is used in electric drive system 10.

System 10 may further include a monitoring and control mechanism or control system 28. Control system 28 may be equipped with certain components for monitoring various states of electric drive system 10, including junction temperatures in power semiconductor devices therein. System 28 in particular may include an analog to digital converter (ADC) 34, a field programmable gate array (FPGA) 38 that includes a control unit 36, a first sensing mechanism or phase current sensor 32, a second sensing mechanism or voltage sensing mechanism 30, the operation of all of which will be further apparent from the following description.

Power module 15 may further include a plurality of power semiconductor devices. In a practical implementation strategy, each of legs 19 is equipped with two sets of two power semiconductor devices, each including a transistor 50 and a diode 52 in the nature of an insulated gate bipolar transistor (IGBT) module. Transistor 50 and diode 52 are connected electrically in parallel with one another such that diode 52 functions as a so-called freewheeling diode 52. Those skilled in the art will appreciate that transistor 50 and diode 52 will not ordinarily both conduct any substantial electrical current at the same time. Accordingly, due to the arrangement of transistor 50 and diode 52, as an alternating electrical current is supplied to load 14 transistor 50 and diode 52 will each alternate between an on-state conducting electrical current, and an off-state not conducting electrical current, but will not both be on or off at the same time. Phase current sensor 32 will operate to sense a direction of the alternating electrical current at any given time so as to determine which of transistor 50 and diode 52 is in an on-state, and may also be structured to determine a level or magnitude of the electrical current for reasons further discussed herein.

Voltage sensing mechanism 30 may be structured to sense a voltage drop across each one of power semiconductors 50 and 52. As noted above, phase current sensing mechanism 32 can be used to detect phasing of electrical currents supplied to motor/load 14, and thereby determine which of power semiconductor components 50 and 52 is passing electrical current at any given time. A positive or forward electrical current means that the transistors in the corresponding phase leg 19 are conducting electrical current, whereas a negative or reverse electrical current means that the corresponding diodes are conducting electrical current. In other circuit designs or alternative combinations of power semiconductors, or depending upon still other factors such as active control techniques the relationships might be different. A sensing lead or contact 54 is shown connecting one phase with sensing mechanism 32, and it will be understood that additional connections or sensing leads for additional phase legs will typically be provided. Mechanism 30 can be used via appropriate connections to power module 15 to sense voltage across any of transistors 50 as well as any of diodes 52, and thereby estimate their junction temperatures as further discussed herein.

As noted above FPGA 38 may include a control unit 36, including any suitable microprocessor. In a practical implementation strategy, control unit 36 may be structured by way of suitable programming to calculate or otherwise determine a value indicative of an estimated junction temperature in the one of the first and second power semiconductors that is presently in an on-state conducting electrical current, responsive to the sensed voltage drop as indicated via sensing mechanism 30 and the sensed direction of flow of electrical current as indicated via sensing mechanism 32. Those skilled in the art will appreciate that the calculated value could be a number value equal to estimated degrees Celsius, for instance, or a value indicative of a temperature range. For instance, the calculated value might correspond to a low temperature, a medium temperature or a high temperature. If the value satisfies predetermined criteria, control unit 36 might output a warning signal such as a signal to a user interface 40. The predetermined criteria might be a range for the value, such as being high enough so as to indicate an estimated junction temperature that approaches or exceeds design specifications. Control unit 36 might also compare the value with a threshold value and output a signal responsive to the comparison. For instance, control unit 36 might output a signal that encodes or is otherwise indicative of a number of degrees Celsius different from a maximum temperature rating. While temperature monitoring can be used for purposes as described herein related to alerting to the risk of equipment damage or failure, those skilled in the art will appreciate that in other instances temperature estimation can be used for diagnostic or performance monitoring purposes, or still others. Also coupled with mechanism 28 is a user interface 40 as mentioned above, such as a desktop or laptop computer or a dedicated electric drive system service tool. It should be appreciated that placing certain of the control functions contemplated herein in or on control unit 36 is but one of a number of different strategies that might be employed, and the particular location of control functions described is not intended to be limiting. Control system 28 may also include a third sensing mechanism 51 that senses a gate voltage of any selected one of the power transistors in system 10.

Figure 2:
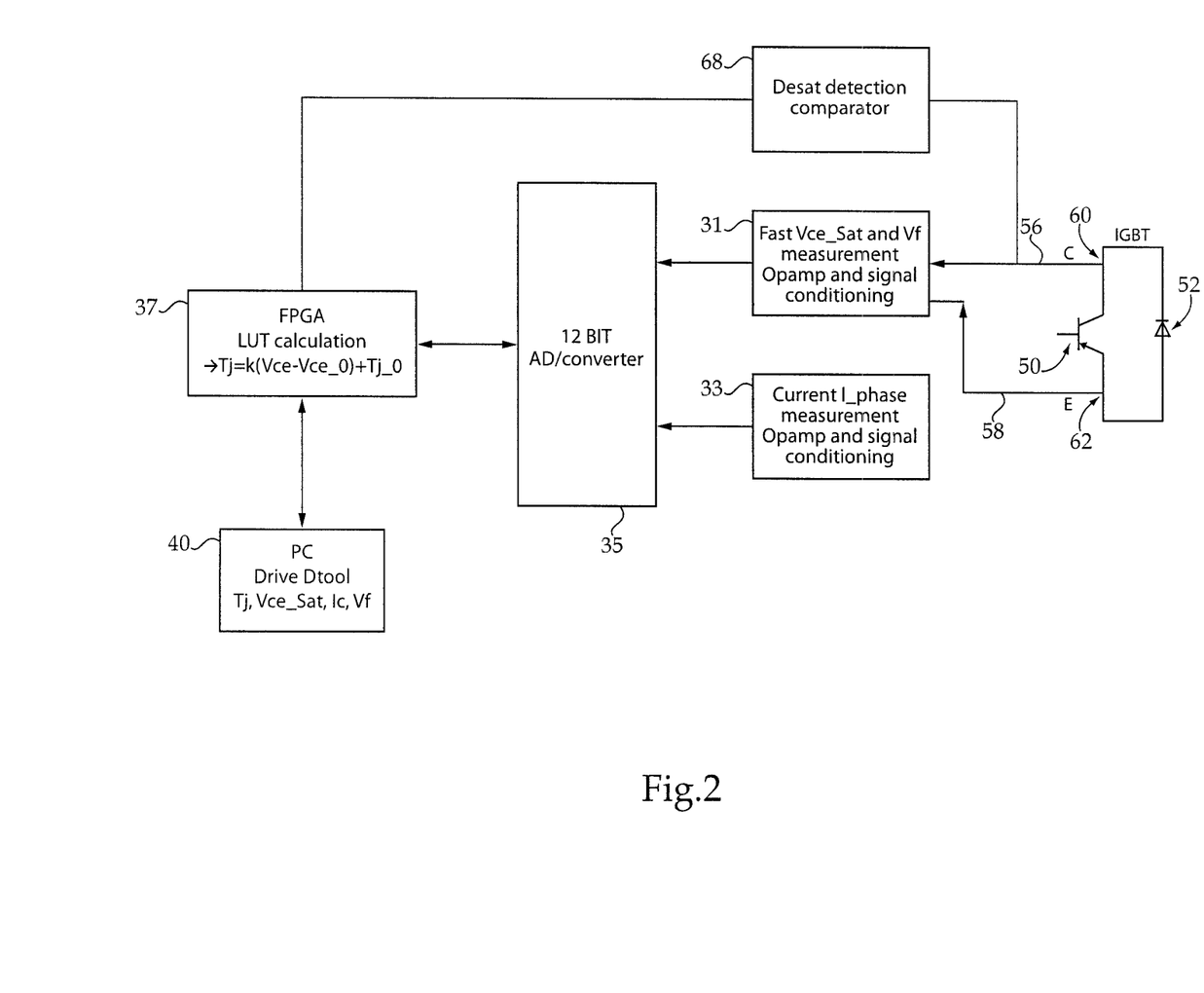
FIG. 2 is a block diagram of digital logic implemented in connection with operating the system of FIG. 1.

Referring now to FIG. 2, there is shown a block diagram illustrating control logic executed in connection with operating electric drive system 10. In FIG. 2, power semiconductor device 50 is shown coupled electrically in parallel with power semiconductor device 52. In the case of a transistor, device 50 includes a collector 60 and emitter 62, with electrical sensing leads 56 and 58 of sensing mechanism 30 connected thereto. It can be seen from FIG. 2 that sensed voltage at collector 60 and sensed voltage at emitter 62 are considered at block 31, where a number of functions are executed including a fast Vce_sat and Vf measurement via an operational amplifier, and signal conditioning. Vce_sat is a voltage drop at saturation across a transistor, whereas Vf is analogously a voltage drop across a diode. Generally in parallel, current phase measurement via an operational amplifier, and signal conditioning occurs at block 33. A Desat detection comparator block 68 is shown in parallel with blocks 31 and 33 where a determination is made that the transistor is on. Outputs of blocks 31 and 33 are processed analog to digital at block 35. At block 37 a lookup table (LUT) calculation to estimate junction temperature of the corresponding power semiconductor based on the sensed voltage drop is performed, as further described herein. Block 40 represents the tool or operator interface 40 where junction temperature, voltage across the power semiconductor device 50, current, voltage across power semiconductor device 52, and aging state or still other factors are evaluated and optionally displayed or made available to an operator or service technician.

Figure 3:
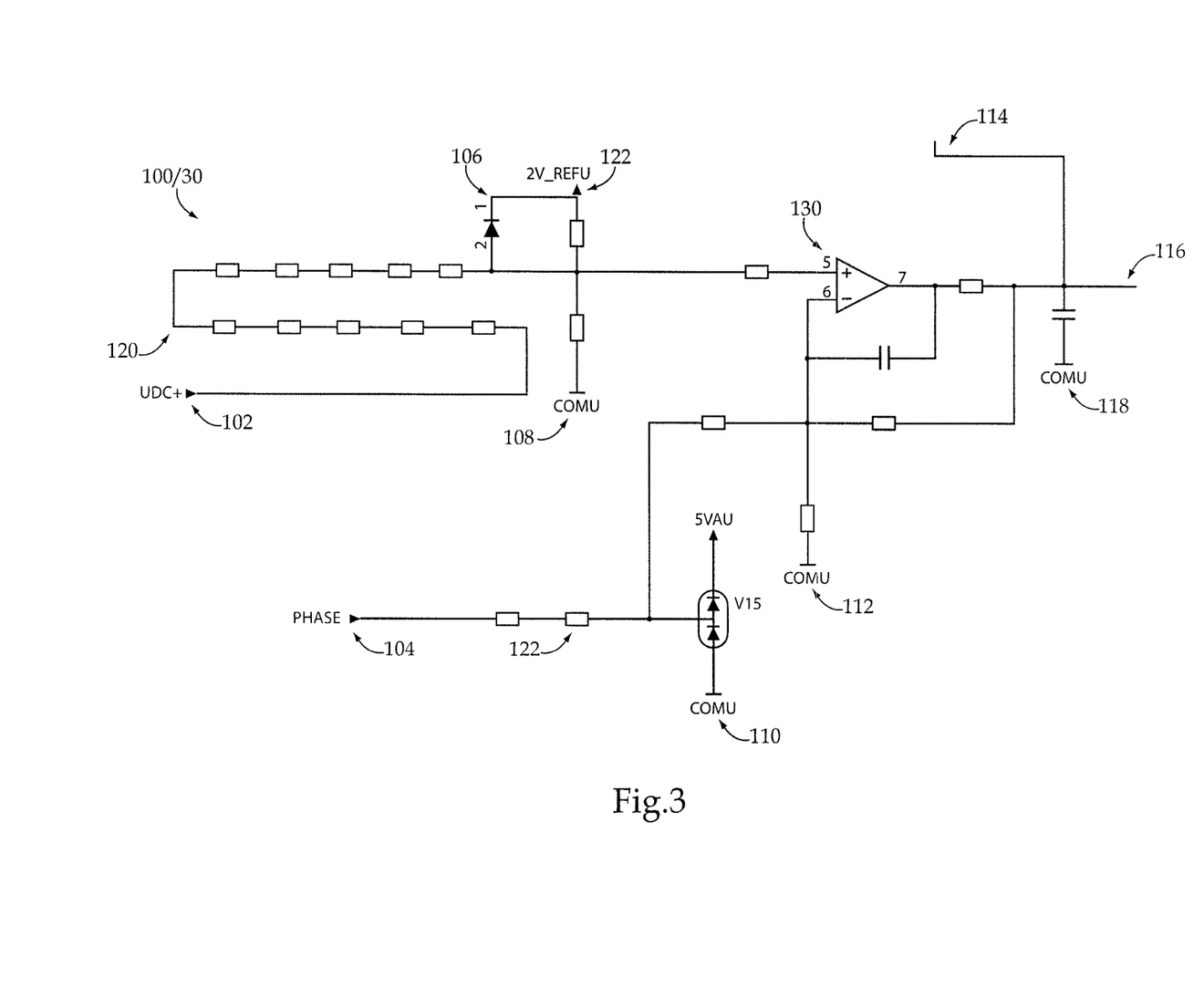
FIG. 3 is a circuit schematic of a circuit for monitoring voltage across a semiconductor, according to one embodiment.

Referring now to FIG. 3, there is shown circuitry 100 of sensing mechanism 30 in greater detail. In FIG. 3, a first input lead 102 or electrical terminal UDC+ monitors voltage of the collector 60 and/or anode of diode 52, whereas a second input or electrical terminal 104 PHASE monitors voltage of emitter 62 and/or the anode of diode 52. Also shown in FIG. 3 is a first resistor string 120 coupled between lead 102 and a clamping component 106 that clamps input voltage during an off state of transistor 50. Clamping component 106 may include a diode and a +2V reference voltage terminal coupled with electrical terminal 102. The +2V reference voltage compensates for different voltage drop ranges associated with transistor 50 versus diode 52. Adding 2V thus allows the same circuit to be used for sensing voltage across either of transistor 50 or diode 52, with the sensed voltages being processed according to different control logic. It will be recalled that phase current measurement is used to determine which of the power semiconductors is to be evaluated. A ground potential is shown via reference numeral 108. Another resistor string 122 is coupled to lead 104. An operational amplifier 130 compares voltage sensed via input 102 with voltage sensed via input 104, compensated by clamping component 106, and outputs a signal indicate of a difference between the two to ADC 34 for further processing as described herein. Reference potentials are shown via numerals 110 and 112 and also 118. Additional resistive elements are shown but not specifically numbered. An output of operational amplifier 130 is provided to two channels 114 and 116 for processing in the manner described herein.

Figure 5:
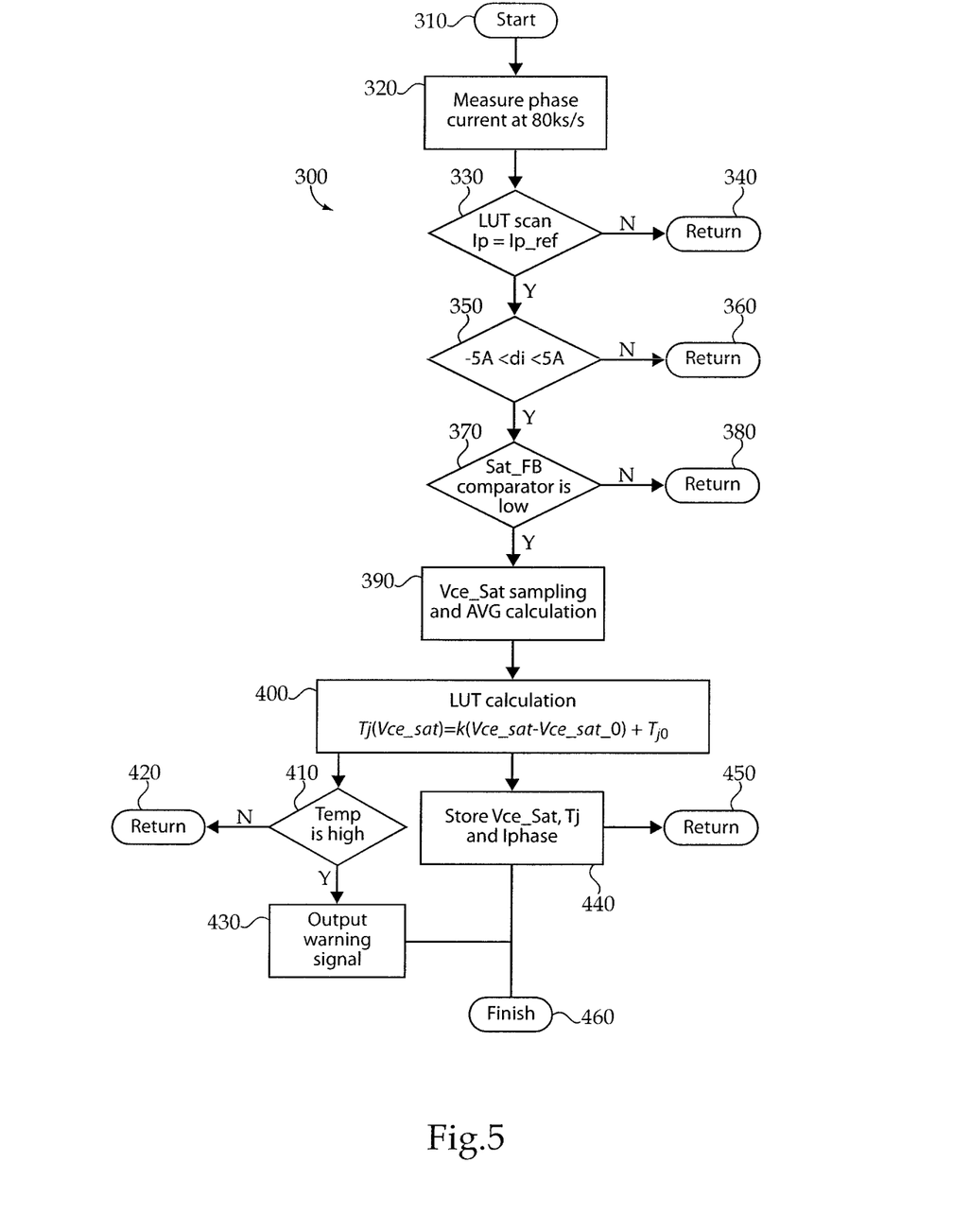
FIG. 5 is a flow diagram of a process according to one embodiment.

Turning now to FIG. 5, there is shown a flowchart 300 illustrating an example process according to the present disclosure. The process of FIG. 5 will START at block 310, from which the logic advances to block 320 phase current is measured at 80 ks/s sampling rate. From block 320 the logic may advance to block 330 to execute a look up table scan where the phase current is compared to values in look up tables for the IGBT and for the diode so as to determine which of the IGBT or diode is conducting. If no match is found the logic may return at block 340. If the scan returns true at block 330, the logic may advance to block 350. To reduce estimation errors due to on-state voltage current dependency di/dt is monitored during the sampling. At block 350 a determination is made as to whether dI>5 A or dI<−5 A, in which case all Vce_sat samples are rejected and the logic returns at block 360. If the query at block 350 returns true a phase current match has been found, and the logic advances to block 370 where a determination is made as to whether the Desat comparator is low. If yes, then the IGBT is on, and the logic will advance to block 390 to sample Vce_sat at 500 ks/s sample rate. If no, the logic may return at block 380.

From block 390 the logic may advance to block 400 to execute a lookup table calculation according to the equation:

$$Tj(Vce\_sat) = k(Vce\_sat - Vce\_sat\_0) + T_{j0}$$

where $k = (Tj\_1 - Tj\_0)/(Vce\_1 - Vce\_0)$;
Tj_1, T_j0, Vce_1, Vce_0 are measured initial values at constant current level Ic, determined during off-line calibration. Vce_sat is on-line measured IGBT on-state voltage and Tj is estimated online junction temperature. From block 400 the logic advances to block 440 where calculated Vce_sat values are stored in computer memory, and may return at block 450. The logic may advance from block 400 in parallel to block 410 to query whether temperature is high, in other words higher than a predefined threshold. If no, the logic may return at block 420. If yes, the logic may advance to block 430 and as described herein output a warning signal. The process finishes at block 460. While the foregoing description is in the context of estimating IGBT junction temperature, analogous processing can be performed for diode junction temperature estimation.

According to the above equation relating junction temperature to voltage drop, it should be appreciated that the voltage drop between the collector and the emitter may vary not only with temperature but also with current level and gate voltage. In a diode the gate voltage is not a factor. With current level, and in the case of a transistor the gate voltage, held constant, the above equation can be applied such that the sensed voltage drop can indicate junction temperature. As suggested above, offline calibration may be performed for power semiconductors in an electric drive system where values for voltage drop at each of a range of temperatures are recorded for a given power semiconductor or class of power semiconductors. In one practical implementation strategy, voltage drops are recorded at a constant current level for a plurality of temperatures, enabling the determination of gain values k for use in the above calculation. This data gathering process can be repeated at different current levels, and the different gains stored in lookup tables for the transistor and the diode. Depending upon a level of the electrical current conducted through a power semiconductor in the on-state, control unit 36 can look up a stored gain from the appropriate lookup table by which to multiply a difference Vce_sat−Vce_sat_0 in the above equation. For an IGBT, gain can be expected to be positive and decrease with increased current levels. For a diode gain can be expected to be negative and increase with increased current levels. Above certain relatively high current levels such as about 350 A or 400 A in the case of an IBGT and about 200 A or about 250 A in the case of a diode, reliability of junction temperature estimation according to the presently disclosed techniques may be reduced.

Figure 4:
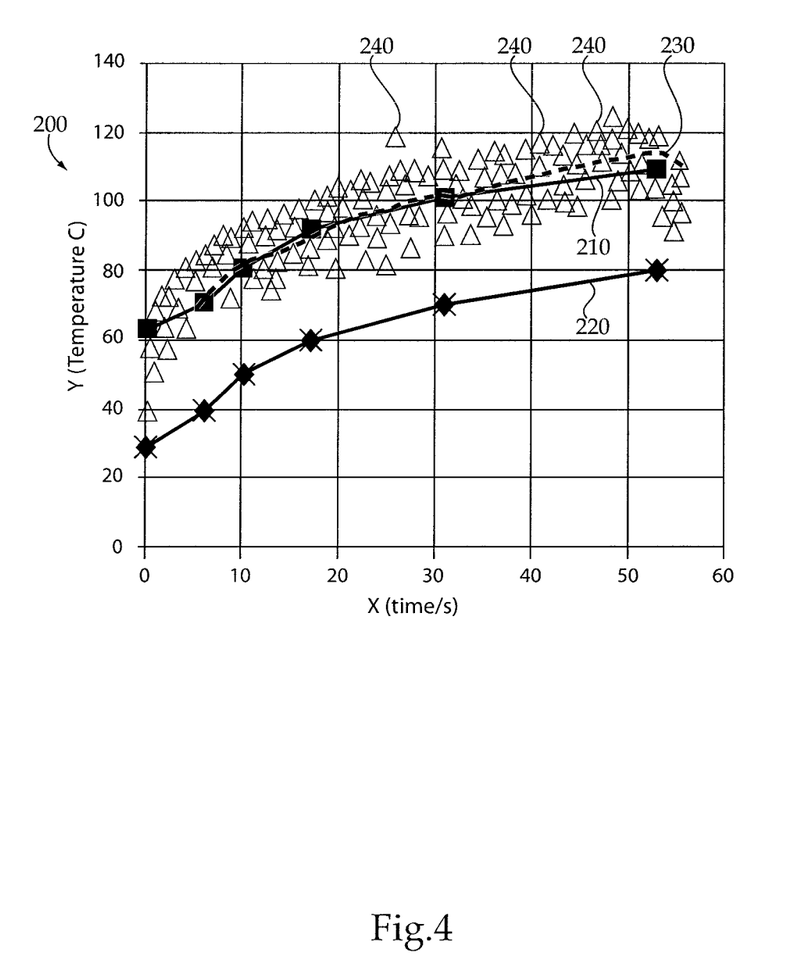
FIG. 4 is a graph of estimated and measured temperatures in a power semiconductor device.

Referring to FIG. 4, there is shown a graph 200 illustrating temperature on the Y-axis and time on the X-axis, where three graph lines are shown 210, 220, 230, corresponding to a measured case temperature, a measured junction temperature 220, and an estimated junction temperature, respectively, all for an IGBT. Reference numeral 240 identifies a plurality of estimated junction temperatures at a plurality of experimental data points. Graph line 220 is a 30 sample moving average in FIG. 4, derived from data points 240 in accordance with the temperature estimation techniques set forth herein. Case temperature and junction temperature data was obtained with a thermal camera. It can be seen from FIG. 4 that the estimated temperatures generally tracks the observed temperatures.

Figure 6:
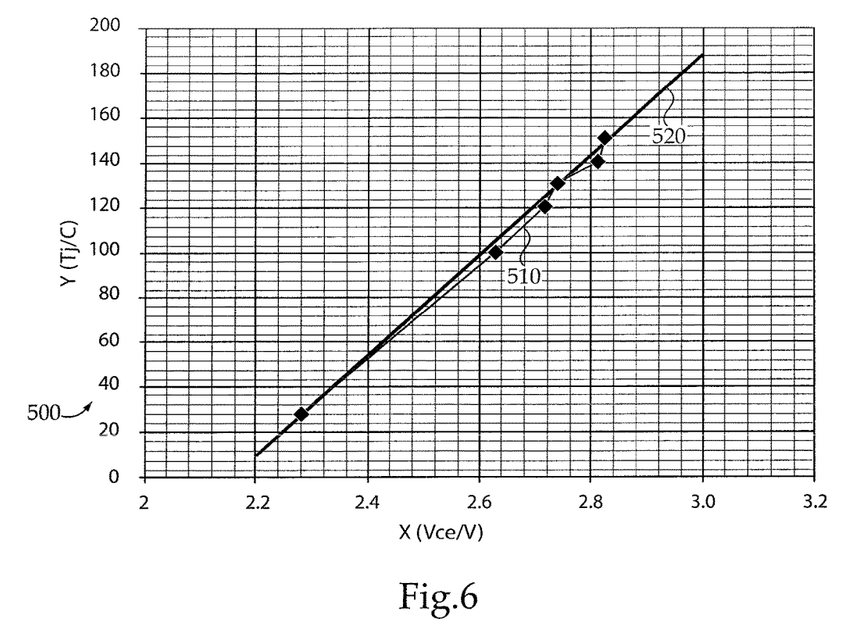
FIG. 6 is a graph relating voltage drop and temperature in a power semiconductor.

Referring to FIG. 6, there is shown a graph illustrating on-state temperature dependence of voltage drop for an IGBT at a fixed current level of 400 A and a gate voltage of 15V. Linearized temperature is shown on the Y-axis versus voltage drop across the IGBT on the X-axis, with a max linearization error of about 5 degrees C. using two point linearization. Graph line 510 identifies measured junction temperature, whereas graph line 520 identifies estimated junction temperature according to the present disclosure. The general agreement between estimated and measured temperature is readily apparent.

Figure 7:
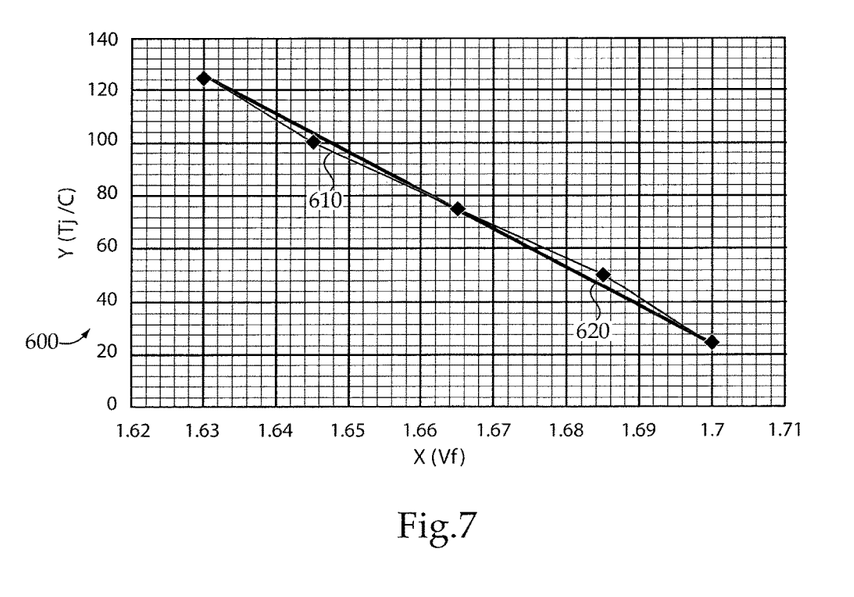
FIG. 7 is a graph relating voltage drop and temperature in another power semiconductor.

Referring to FIG. 7, there is shown a graph 600 illustrating on-state temperature dependence of voltage drop for a diode at a fixed current level of 450 A, with a max linearization error of about 5 degrees C. using two point linearization. Graph line 610 represents estimated junction temperature according to the present disclosure, whereas graph line 620 represents measured junction temperature. The general agreement between estimated and measured temperature is readily apparent. It will be noted the relationship between voltage drop and temperature in the case of a diode as in FIG. 7 is generally opposite to the relationship between voltage drop and temperature in the case of an IGBT as in FIG. 6. In the case of either of the FIG. 6 or FIG. 7 examples, three point linearization could reduce the error.

From the foregoing description, it can be seen that transistor and diode real time junction temperatures can be estimated using on-state voltage temperature dependencies and phase current measurement in the inverter section or inverter module of an electric drive system. Temperature estimates can have numerous applications, relating not only to detecting or predicting failure but also analytical purposes relating to performance and tuning. Defects or limitations may be evident as early as in production testing, and can verify correct temperature levels and stresses during drive operation in the field. Techniques set forth herein can also detect temperature differentials between individual power semiconductor chips inside a transistor module, for instance due to uneven thickness of thermal paste, base plate bending or uneven current share.

The present description is for illustrative purposes only, and should not be construed to narrow the breadth of the present disclosure in any way. Thus, those skilled in the art will appreciate that various modifications might be made to the presently disclosure embodiments without departing from the full and fair scope and spirit of the present disclosure. Other aspects, features and advantages will be apparent upon an examination of the attached drawings and appended claims.

What is claimed is:

1. A method of operating an electric drive system comprising: alternately conducting electrical current through a first power semiconductor and a second power semiconductor in the electric drive system, dependent upon an alternating direction of flow of the electrical current; monitoring the direction of flow of the electrical current so as to determine which one of the first and the second power semiconductors is in an on-state conducting the electrical current; monitoring a voltage drop across the one of the first and the second power semiconductors in the on-state; calculating a value indicative of an estimated junction temperature in the one of the first and the second power semiconductors in the on-state responsive to the voltage drop; and outputting a temperature warning signal responsive to the determined value; wherein the act of monitoring a voltage drop is performed using circuitry comprising an operational amplifier configured to compare a first voltage with a second voltage to determine a voltage drop across the one of the first power semiconductor and the second power semiconductor in the on-state, and wherein before performing the act of calculating the value indicative of an estimated junction temperature, a process is executed, the process comprising: first measuring a phase current, second executing a lookup table scan wherein the phase current is compared to reference values for the first power semiconductor and the second power semiconductor so as to determine whether the phase current matches a reference value for the first power semiconductor or a reference value for the second power semiconductor, and third determining whether di/dt of the phase current is greater than a first value and less than a second value, and fourth evaluating whether the first semiconductor device is on, wherein the process returns to the first operation when any of the second, third and fourth operations is false and proceeds to the act of calculating the value indicative of an estimated junction temperature for the first power semiconductor when the second, third and fourth operations are true.

2. The method of claim 1, wherein alternately conducting the electrical current includes inverting direct (DC) current so as to synthesize alternating (AC) current, and further comprising supplying the AC current to an external electrical load.

3. The method of claim 1, wherein outputting the temperature warning signal includes outputting the temperature warning signal to a user interface of the electric drive system.

4. The method of claim 1, wherein the first and the second power semiconductors are connected in parallel with one another in one of a plurality of phase legs in the electric drive system.

5. The method of claim 4, wherein the first power semiconductor includes a transistor.

6. The method of claim 5, wherein the second power semiconductor includes a diode.

7. The method of claim 1, wherein calculating the value further includes calculating the value responsive to the monitored voltage drop and also to a stored gain.

8. The method of claim 7, wherein determining the value further includes looking up the stored gain in an offline-populated table.

9. A method of operating an electric drive system comprising: alternately conducting electrical current through a first power semiconductor and a second power semiconductor in the electric drive system, dependent upon an alternating direction of flow of the electrical current; monitoring the direction of flow of the electrical current so as to determine which one of the first and the second power semiconductors is in an on-state conducting the electrical current; monitoring a voltage drop across the one of the first and the second power semiconductors in the on-state; calculating a value indicative of an estimated junction temperature in the one of the first and the second power semiconductors in the on-state responsive to the voltage drop; and outputting a temperature warning signal responsive to the determined value; wherein before performing the act of calculating the value indicative of an estimated junction temperature, a process is executed, the process comprising: first measuring a phase current, second executing a lookup table scan wherein the phase current is compared to reference values for the first power semiconductor and the second power semiconductor so as to determine whether the phase current matches a reference value for the first power semiconductor or a reference value for the second power semiconductor, and third determining whether di/dt of the phase current is greater than a first value and less than a second value, wherein the process returns to the first operation when either of the second operation and the third operation is false and proceeds to the act of calculating the value indicative of an estimated junction temperature for the first power semiconductor when the second operation and the third operation are true.

10. The method of claim 9, wherein the act of monitoring a voltage drop is performed using circuitry comprising: a first resistor string coupled to a first electrical terminal to monitor a first voltage of the first power semiconductor or the second power semiconductor, a second resistor string coupled to a second electrical terminal to monitor a second voltage of the first power semiconductor or the second power semiconductor, and an operational amplifier coupled with the first resistor string and the second resistor string and configured to compare the first voltage with the second voltage to determine the voltage drop across the one of the first power semiconductor and the second power semiconductor in the on-state.

11. The method of claim 9, wherein monitoring the voltage drop includes sensing voltages of a first electrical terminal and a second electrical terminal in a sensing mechanism, and each of the first and the second electrical terminals being coupled with each of the first and the second power semiconductors.

12. The method of claim 9, wherein alternately conducting the electrical current includes inverting direct (DC) current so as to synthesize alternating (AC) current, and further comprising supplying the AC current to an external electrical load.

13. The method of claim 9, wherein outputting the temperature warning signal includes outputting the temperature warning signal to a user interface of the electric drive system.

14. The method of claim 9, wherein the first and the second power semiconductors are connected in parallel with one another in one of a plurality of phase legs in the electric drive system.

15. The method of claim 14, wherein the first power semiconductor includes a transistor.

16. The method of claim 15, wherein the second power semiconductor includes a diode.

17. The method of claim 9, wherein calculating the value further includes calculating the value responsive to the monitored voltage drop and also to a stored gain.

18. The method of claim 17, wherein determining the value further includes looking up the stored gain in an offline-populated table.

* * * * *